United States Patent [19]

Vogt et al.

[11] Patent Number: 5,119,093
[45] Date of Patent: Jun. 2, 1992

[54] APPARATUS FOR CONVERTING A SIGNAL OF A FIRST SAMPLE RATE INTO A SIGNAL OF A SECOND SAMPLE RATE

[75] Inventors: Lothar Vogt, Hohenhameln; Dieter Poschen, Hildesheim, both of Fed. Rep. of Germany

[73] Assignee: Blaupunkt-Werke GmbH, Hildesheim, Fed. Rep. of Germany

[21] Appl. No.: 528,588

[22] Filed: May 24, 1990

[30] Foreign Application Priority Data

Jun. 9, 1989 [DE] Fed. Rep. of Germany ....... 3918866

[51] Int. Cl.$^5$ .............................................. H03M 5/02
[52] U.S. Cl. ..................................... 341/123; 341/54; 328/15
[58] Field of Search ............. 341/63, 52, 53, 64, 341/152, 157, 123, 122, 124, 125; 364/724.1; 328/15, 17, 25, 34, 55, 219.1, 271; 375/111

[56] References Cited

U.S. PATENT DOCUMENTS 4,460,890  7/1984  Busby .................................. 341/122
4,990,911  2/1991  Fujita et al. ........................ 341/123

Primary Examiner—A. D. Pellinen
Assistant Examiner—B. K. Young
Attorney, Agent, or Firm—Frishauf, Holtz, Goodman & Woodward

[57] ABSTRACT

Sample values of a digital signal of a first sample rate are supplied to a digital filter for conversion into a digital signal of a second sample rate. The coefficients of the digital filter are calculated by a processor from the ratio of the sample rates or are obtained by a read-only memory containing sets of coefficients for respective sample rate ratios for which the apparatus is usable. Filtered sample values are read out of the digital filter at the desired second sample rate. A buffer memory is used at the input of the digital filter and a regulator is provided to prevent fluctuations in the filling of the buffer memory from emptying or exceeding the capacity of the buffer memory.

13 Claims, 4 Drawing Sheets

APPARATUS FOR CONVERTING A SIGNAL OF A FIRST SAMPLE RATE INTO A SIGNAL OF A SECOND SAMPLE RATE

The invention concerns changing the sample rate of audio signals.

Various signal sources in digital audio systems utilize different sample rates. For example a sample rate of 44.1 kHz is necessary for compact disk players, 48 kHz for digital audio tape (DAT) equipment and 38 kHz for the analog-to-digital converted low frequency signals of VHF radio broadcasts. A single sample rate is necessary, however, for unitary processing of signals, for example filtering them or digital-to-analog conversion.

SUMMARY OF THE INVENTION

It is an object of the present invention to provide equipment by which signals of different sample rates can be converted so as to provide a common sample rate at which all can be processed.

Briefly, the sample values of a signal are supplied to a digital filter of which the coefficients are provided in a manner dependent upon the ratio of the sample rates and the sample value are read out of the digital filter at the sample rate into which the input samples were to be converted. The filter is preferably a FIR filter. The coefficients are formed according to a function of which the Fourier transform satisfies a specified set of conditions further set forth below.

The apparatus of the invention has the advantage that the sample rates of the individual signal sources do not need to have any particular number ratio to each other or to the unitary sample rate to which they are being converted. In addition outstanding signal quality and an excellent margin against disturbance is obtainable.

In an important embodiment of the invention the signal of a first sampling rate is supplied through a device for oversampling. In that way a particularly favorable implementation of the apparatus of the invention is possible by means of a digital signal processor. In that case the timing pulses of the first and second sampling rate are so intercoupled that they then have the same error tolerance.

In the apparatus of the invention, a mathematical procedure is used for calculating the sample values for the second sample rate. This procedure is known under the designation of "generalized sample sequences." For this purpose the calculation begins from a Fourier transform of a function g that is defined by $$g^{\wedge}(v) = (\tfrac{1}{2}\pi) \int_{-\infty}^{\infty} g(x) \cdot e^{-ivx} dx$$

and in which v is a real number and $i = \sqrt{-1}$. If $\Phi$ is a time bounded function with the time boundary $T \geq 0$, which means $\Phi(t) = 0$ for $|t| \geq T$, and the following holds for the Fourier-transformed $\Phi$:

$$D^j\Phi^{\wedge}(2\pi k) = \begin{cases} \delta_{j,0}, & k = 0, \\ 0, & k \neq 0, \end{cases} \quad j = 0, \ldots, r$$

wherein $D^j$ is the jth derivative, $\delta_{j,0} = 1$ for $j = 0$ and $\delta_{j,0} = 0$ for j unequal to O, so that equation (1) set forth below holds for an r-fold continuously differentiable function f:

$$\max \left| \sum_{k=[t/T_0 - T]+1}^{[t/T_0 + T]} \{f(k \cdot T_0) \cdot \Phi(t/T_0 - k)\} - f(t) \right| \leq C \cdot T_0^r \quad (1)$$

In the above [x] (Gaussian brackets) signifies the greatest whole number which is smaller than or equal to x. C is a constant independent of t and $T_0$ and t is a real number. Equation (1) signifies that f can be approximated by the sum and, indeed, can be approximated the better, the smaller $T_0$ is. $T_0$ is in practice smaller than the Nyquist rate of the signal.

Equation (1) can be rewritten as follows:

$$f(t) = \sum_{k=[t/T_0 - T]+1}^{[t/T_0 + T]} f(k \cdot T_0) \cdot \Phi(t/T_0 - k) + R(\Phi; T_0) \quad (2)$$

In the above $R(\Phi; T_0)$ is the approximation error. Since equation (2) holds for all values of t which are real numbers, it holds particularly for $t = n \cdot T_1$, wherein n is a natural number. In consequence we have the following result:

$$f(n \cdot T_1) = \sum_{k=[nT_1/T_0 - T]+1}^{[nT_1/T_0 + T]} f(k \cdot T_0) \cdot \Phi(n \cdot T_1/T_0 - k) + R(\Phi; T_0) \quad (3)$$

Equation (3) sets forth the calculation of a signal $f(n \cdot T_1)$ with the desired sample rate $T_1$ out of a signal $f(k \cdot T_0)$ of the present sample rate $T_0$. Equation (3) can be interpreted as a non-recursive filter with time-dependent coefficients which can be expressed as function values of the function $\Phi$.

Linear combinations of so-called B splines have been found ( particularly suitable for the function $\Phi$, since they are distinguished by
 (i) a polynomial of low degree for high approximation quality and
 (ii) low time boundary T, as a result of which it follows that a filter of low order is assured.

The calculation of the function $\Phi$ takes place according to the following equations:

$$\Phi(t) = \sum_{l=1}^{s} \gamma_l \cdot B_{p_l}(t)$$

wherein s is a natural number. The numbers p1, p2... are greater than or equal to 2 with p1 smaller than p2, ..., ps-1 smaller than ps. The coefficients $\gamma l$ satisfy the linear equation system according to Vandermonde.

$$\sum_{l=1}^{s} \gamma_l p_l^m = \begin{cases} 1, & m = 0, \\ 0, & m = 1, \ldots s - 1 \end{cases}$$

$B_m$ are the so-called B splines. They can be calcuted according to the equations $$B_m(t) = \{1/(m-1)!\} \sum_{j=0}^{[m/2-|t|]} (-1)^j \binom{m}{j} (m/2 - j - |t|)^{m-1}.$$

-continued $$|t| \leq m/2.$$

and $$B_m(t) = 0, |t| > m/2.$$

where m is a natural number greater than 1 and t is a real number. Thus for example $B_2(t) = 1 - |t|$ for $|t|$ less than or equal to 1 and $B_2(t) = 0$ for $|t|$ greater than 1. Simple realizations, for example with $s = 2$, $p1 = 4$, $p2 = 5$, lead to $$\Phi(t) = 5B_4(t) - 4B_5(t)$$

or with $s = 3$, $p1 = 6$, $p2 = 7$, $p3 = 8$ to $$\Phi(t) = 28B_6(t) - 48B_7(t) + 21B_8(t).$$

Since the function $\Phi$ is present explicitly, the evaluation and calculation of the time dependent filter coefficients can be carried out in a signal processor. This is particularly possible efficiently if the periodicity in the formula prescribed by the sampling rates $T_0$ and $T_1$ appearing in practice is utilized Thus for example a period is 100 when $T_0 = 1/38$ kHz and $T_1 = 1/200$ kHz. The filter coefficients for calculating the expression $f(T_1)$ and $f(101 \cdot T_1)$ appearing in equation (3) are equal.

The filter coefficients can be calculated in advance for given ratios of sample rates and deposited in a coefficient memory. Furthermore, it is recognizable from the coefficients whenever another sample value $f(k \cdot T_O)$ must be newly brought in. In this connection it should be noted that the digital filter makes use of the number of sample values required in every case in a manner similarly to a moving window.

BRIEF DESCRIPTION OF THE DRAWINGS

The invention is further described by way of illustrative example with reference to the annexed drawings, in which.

DESCRIPTION OF THE ILLUSTRATED EMBODIMENTS

Figure 1:
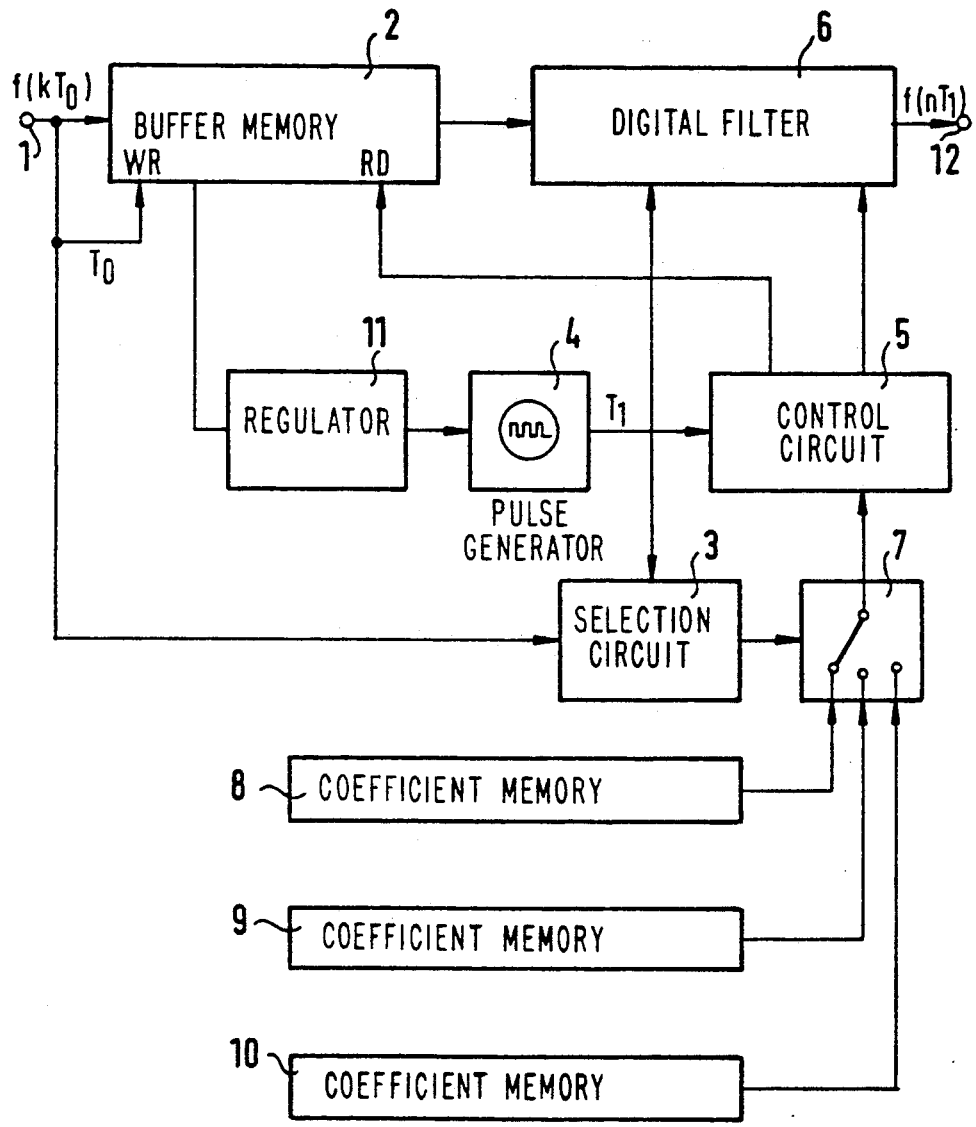
FIG. 1 is a block circuit diagram of apparatus in which the calculation of output sample values according to the invention can be used.

The same parts are designated with the same reference numerals in the several figures. Furthermore, the clock signals $T_0$ and $T_1$ are designated with the same significance as the corresponding sampling rates $T_0$ and $T_1$.

The signal $f(k \cdot T_O)$ having a first sampling rate $T_O$ is supplied at the terminal 1 in FIG. 1. It proceeds to the input of a buffer memory 2. A clock signal $T_O$ derived from the signal is supplied to the write control connection WR of the memory 2 for writing in the signal. The same clock signal $T_O$ is supplied to a selector control 3. A pulse generator 4 produces a clock signal for the second sampling rate $T_1$ and furnishes that clock signal to the control circuit 5, to a digital filter 6 and to the selection control circuit 3.

The selection control circuit 3 recognizes which of several possible values the sampling rate $T_0$ has and, in accordance with that recognition, controls a selector switch 7 accordingly, so that from the appropriate one of the coefficient memories 8, 9 and 10 the filter coefficient will be read out which are suitable for the particular ratio of $T_0$ to $T_1$ that is involved in the operation of the circuit apparatus of FIG. 1. Only three coefficient memories 8, 9 and 10 are shown in FIG. 1. According to the requirement of an equipment of which the apparatus of FIG. 1 is a part it is possible to provide more than three coefficient memories. For simplicity of illustration the selection of the correct set of coefficients is illustrated in terms of a system using a selector switch 7. For implementation of modern memory components, however, in practice the selection of the coefficients would be done by corresponding control of addressing of a memory for reading out the coefficients stored under various addresses. The circuit 3 would simply determine which set of addresses would be used for supplying the coefficients.

The coefficients read out from a memory are supplied to the digital filter 6 with the assistance of a control circuit 5, which controls the reading out of the buffer memory 2 of the necessary sample values of the signal $f(k \cdot T_0)$. For this purpose a signal that is already within the pattern of the output pulses $T_1$ of the pulse generator 4 is supplied by the control circuit 5 to the read control input RD of the buffer memory 2.

Figure 4:
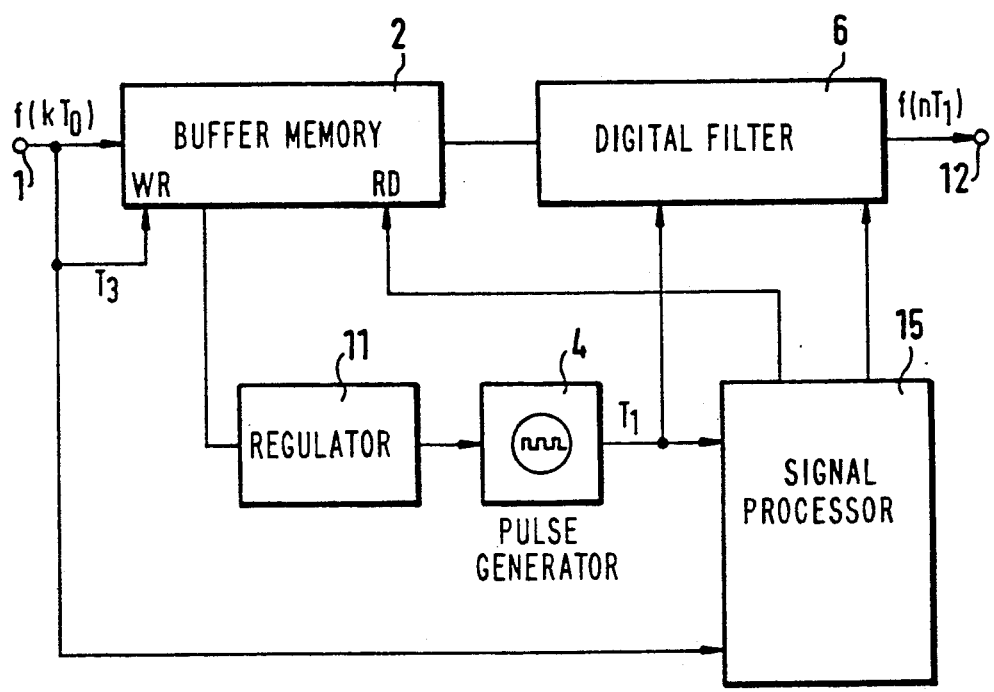
FIG. 4 is a block circuit diagram of apparatus in which the necessary filter coefficients are continually calculated in accordance with the invention.

It can occur that the generator 4 does not oscillate precisely at the frequency which corresponds to the ratio $T_O/T_1$ for which the coefficients have been stored or calculated, as for example is possible in the system of FIG. 4. In accordance with any such deviation (and only then), the control circuit 5 reads (on the average) more or less sample values out of the buffer memory 2 than are supplied from the input 1. In the circuit of FIG. 1 it is therefore provided that the frequency of the generator 4 is regulated in a manner dependent upon the contemporary degree of filling of the memory 2, by means of a regulator unit 11, the output of which is connected to a control input of the generator 4. The regulation loop thus controlled is so designed that in the transient state the buffer memory is half filled.

Figure 2:
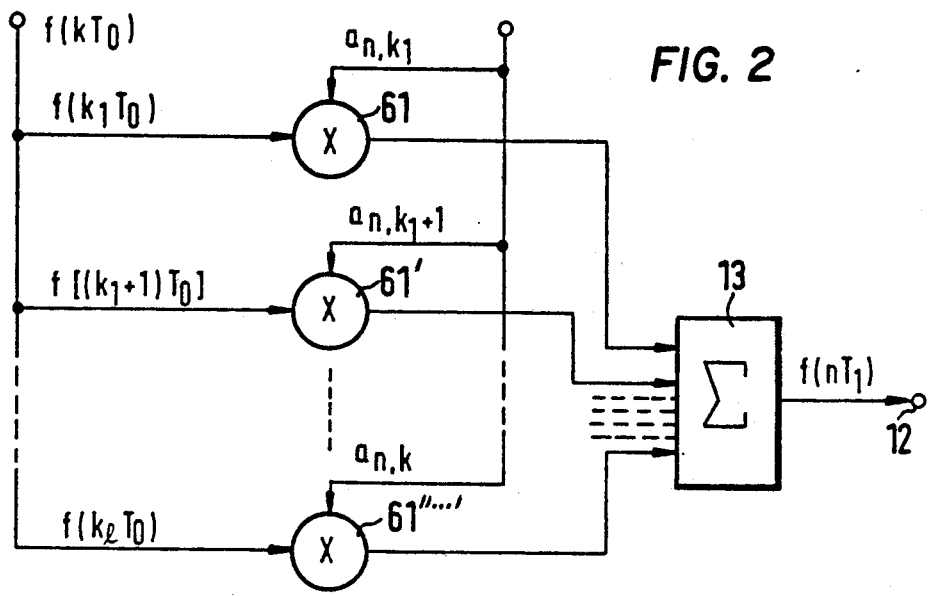
FIG. 2 is a basic circuit diagram of a digital filter in the arrangement illustrated in FIG. 1.

FIG. 2 shows a block circuit diagram of the digital filter 6. Sample values $f(k \cdot T_O)$ of the signal are supplied from the buffer memory 2 (FIG. 1) to the digital filter 6. In this operation, in every case a sample value is supplied to one of the multipliers 61, 61',...61'. Each time a coefficient $a_{n,k1}$, $a_{n,k2}$ ... $a_{n,kl}$ is supplied to the multiplier circuits 61,61', 61"...61". The results of the multiplications are summed in a summing circuit 13, at the output of which the signal $f(n \cdot T_1)$ having the second sampling rate is made available.

Figure 3:
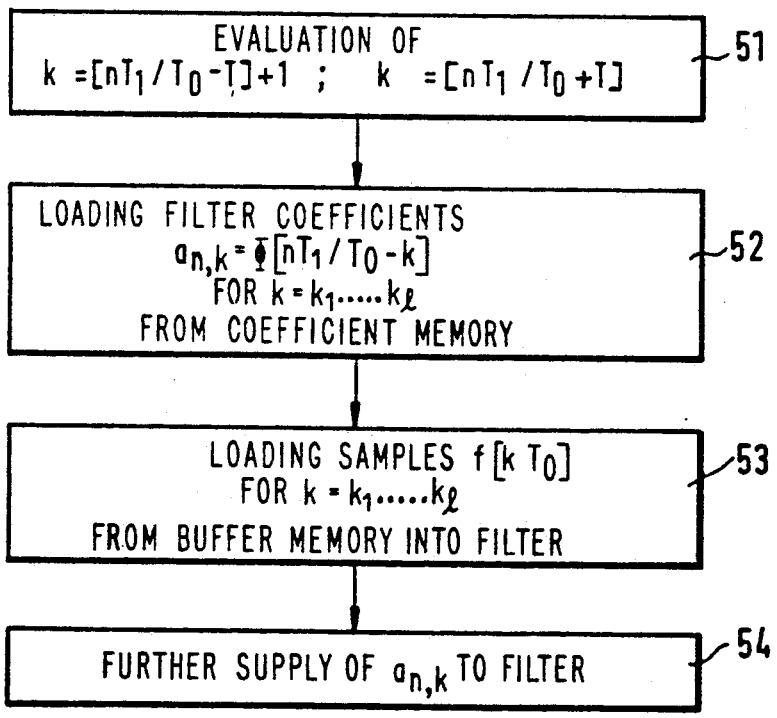
FIG. 3 is a flow diagram representation of the operation of a control circuit in the apparatus illustrated in FIG. 1.

The digital filter 6 can be implemented either as a circuit with individual multipliers and a summing circuit, as shown in FIG. 2, or it can be implemented by a suitably programmed signal processor. This applies also for the control circuit 5, for which parts of a program are illustrated in FIG. 3. As shown in FIG. 3, $k_1$ and $k_l$ are calculated in a first step 51. Next in a program portion 52 the coefficients are unloaded from the coefficient memory. In step 53 the necessary sample values are transferred from the buffer memory into the filter. Finally in step 54 the coefficients are passed on to the filter.

In the embodiment of FIG. 4 the necessary coefficients are continually calculated. For this purpose a signal processor 75 is provided with a corresponding program. The signal processor also assumes the functions of the selector control circuit 3 and the control circuit 5 of FIG. 1. In addition, the selector switch 7 and the coefficient memories 8 to 10 are dispensed with because the signal processor has memory and other capabilities for their functions. The other components and functions of the system of FIG. 4 correspond in other respects to those of the system of FIG. 1.

Figure 5:
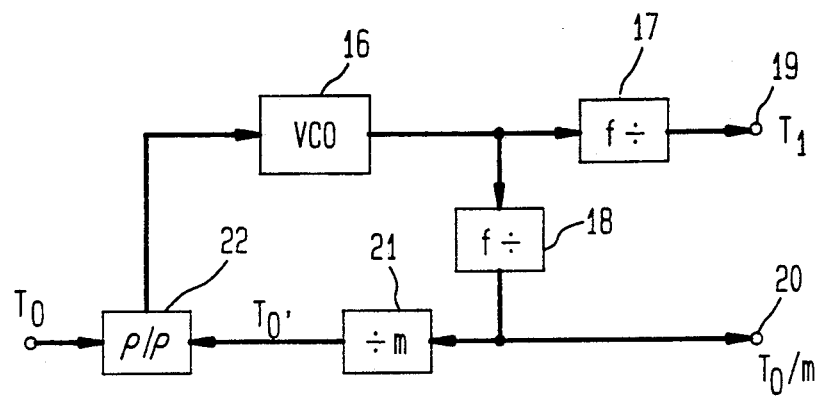
FIG. 5 is diagram of a circuit for generating the clock signals necessary in the apparatus of FIG. 6.
Figure 6:
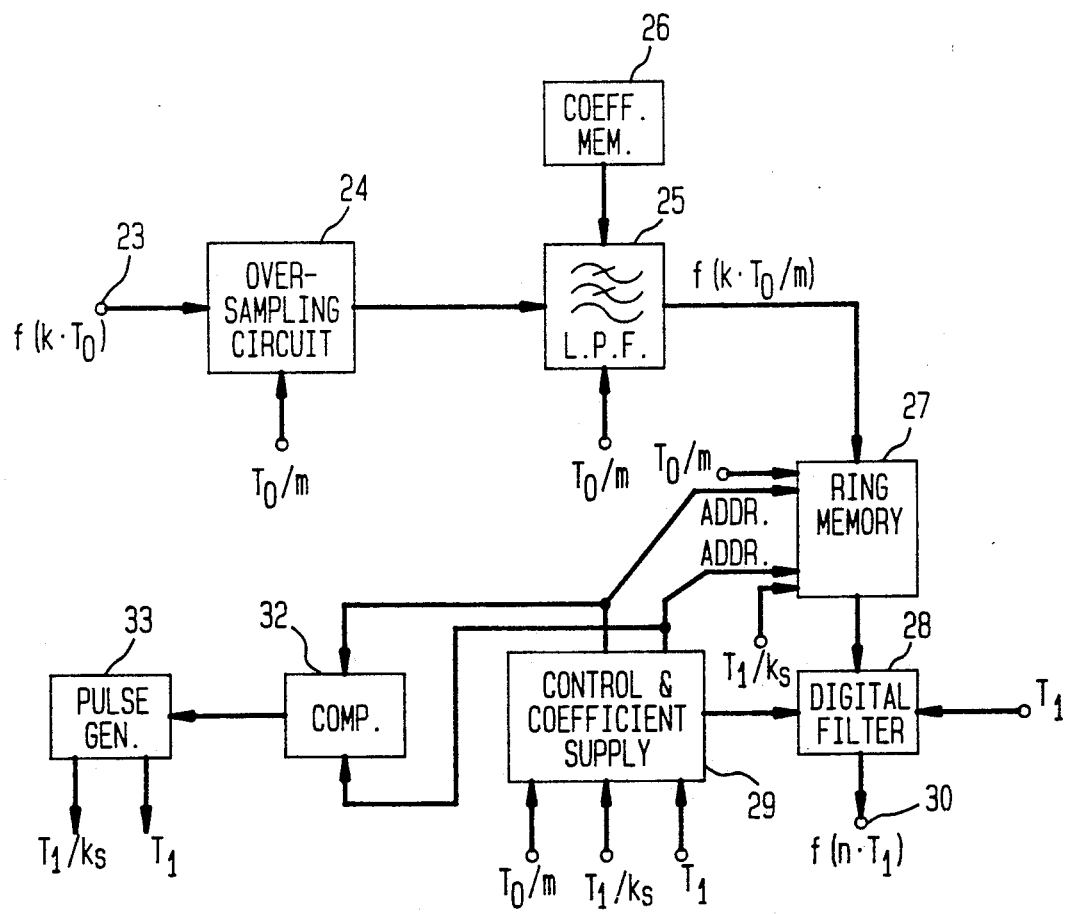
FIG. 6 is a circuit block diagram of a second embodiment of a sample rate conversion circuit according to the invention.

Another embodiment of the invention is shown in FIGS. 5 and 6. FIG. 5 shows a circuit for generating the clock signals necessary in the circuit of FIG. 6. In particular the circuit of FIG. 5 produces an intercoupling of the second clock signal $T_I$ with the first clock signal $T_O$. For that purpose a controllable oscillator 16 is provided, the output signal of which is supplied to two frequency dividers 17 and 18. The sampling rate pulses $T_I$ are generated by the frequency divider 17. These are supplied from the output 19 to the right hand input of block 28 in FIG. 6.

By means of the frequency divider 18 the m-fold multiple $T_0/m$ of the sampling rate pulses T0 are generated and are supplied from an output 20 of FIG. 5 to the circuit blocks 24 and 25 of FIG. 6. At the output of still another frequency divider 21 a signal $T_0'$ is made available which is supplied along with the signal $T_0$ to a phase comparison circuit 22 of FIG. 5. The phase and frequency of the controllable oscillator 16 are regulated in a known way by the output signal of the phase comparison circuit 22

A signal $f(k \cdot T_0)$ of the first sampling rate $T_0$ is supplied at the terminal 23 of FIG. 6 to an oversampling circuit composed of a circuit 24 which is controlled by the oversampling rate $T_0/m$. (m−1) null values are inserted between the individual sample values of the signal $f(k \cdot T_O)$ which arrive at the sampling rate $T_O$. The signal thus obtained is then passed through a low-pass filter 25, the coefficients of which are stored in a coefficient memory 26. The low-pass filter 25 is clocked with the oversampling rate $T_O/m$.

The signal is read out from the low-pass filter 25 also by the oversampling rate $T_O/m$ and is written into a ring memory 27. The ring memory is a known write-/read memory of a known type in which for writing and reading the individual memory locations are cyclically addressed independently of each other. The reading out from the ring memory 27 is produced at a sampling rate of $T_I/k_s$, in which $k_s$ is a natural number. The values read out of the ring memory 27 are supplied to a digital filter 28 that implements the following equation $$f(n \cdot T_1) = \sum_{k=[n \cdot m \cdot T_1/T_0 - T]+1}^{[n \cdot m \cdot T_1/T_0 + T]} f(k \cdot T_0/m) \cdot \Phi(n \cdot m \cdot T_1/T_0 - k)$$

In the above equation T is a number for which $\Phi(x)=0$ while the absolute value of x is greater than or equal to T. $f(k \cdot T_0 m)$ is the signal read into the ring memory 27.

Because of the periodicity in the sampling rates $$p = \frac{T_0}{m} \cdot \text{lcm}\left(\frac{m}{T_0} \cdot \frac{1}{T_1}\right)$$

where lcm signifies the least common multiple and because of the symmetry in $\Phi$, it is necessary only to store $[p/2]+1$ sets of coefficients, where $[p/2]$ is the largest number that is smaller than or equal to p/2.

As an example, the sampling rates of $T_0 = 1/44100$ Hz and $T_1 = 1/48000$ Hz may be assumed. When m = 1, therefore without oversampling, p = 160. There are accordingly 81 sets of coefficients to store. For oversampling of m = 4, on the other hand, p = 40, which corresponds to 21 sets of coefficients.

Each set of coefficients consists of $K_s$ coefficients and a number M belonging to them, from which the addresses can be calculated of the values to be read out from the ring memory. M and $k_s$ can be calculated from the summation limits in equation (4). In the case of favorable ratios M can be a fixed number, so that its storage in the coefficient memory portion of the control processor 29 can be dispensed with. The signal $f(n \cdot T_I)$ having the sampling rate $T_I$ can be obtained from the output 30.

Filter coefficients can be formed according to the function $\Phi$, of which the Fourier transformed functions $\tilde{\Phi}$ satisfy the following equation $$D^j \tilde{\Phi} \ (2\pi k) = \begin{cases} \delta_{j,0} , & k = 0, \\ 0 , & k \neq 0, \end{cases} j = 0, \ldots, r$$

wherein $D^j$ is the jth derivative, $\delta j.O = 1$ for j = 0 and $\delta j,O = 0$ for j other than O, k is an integer and r signifies the extent to which the function f is r-fold continuously differentiable.

For simple applications the regulation of the second sampling rate $T_I$ by means of the circuit shown in FIG. 5 can be dispensed with. Instead of that the reading and writing addresses of the ring memory can be compared. A time positioning magnitude for regulating the timing of the signal of sampling rate $T_I$ can be derived from the variation of the numerical spacing of these addresses.

The scheme above mentioned is illustrated in FIG. 6, where it controls the pulse generator 33 which generates the pulses of the second sample rate $T_I$. The control and filter coefficient supply unit 29, in addition to supplying the filter coefficients to the digital filter 28, supplies read and write addresses to the ring memory 27. The read addresses are furnished at a rate $T_O/m$ and the write addresses at a rate $T_I/k_s$. The addresses are run through cyclically and they can conveniently be in simple numerical progression in both cases so that the numerical lag or lead can be determined as a ready or gradually changing value by the comparison circuit 32. When this circuit is used, the control input input of the controllable oscillator 16 (FIG. 5) is connected to the comparator circuit 32 instead of to the phase comparison circuit 22, which is then omitted from the circuit of FIG. 5. When the scheme just mentioned is not usable, the pulse generator 33 is operated as in FIG. 5, where it is locked to the first sample rate $T_O$.

We claim:

1. Apparatus for converting a first digital signal having a first sample rate $T_0$ into a second digital signal having a second sample rate $T_1$ comprising:

a digital filter (6);

buffer memory means (2) for temporarily storing samples of said first digital signal written into said buffer memory means in step with pulses of said first sample rate;

control circuit means (5) for controlling the storage time of samples in said buffer memory and writing them into said digital filter in step with pulses of said second sample rate and for supplying filter coefficients to said digital filter;

filter coefficient selection means (3) for providing a selected set of filter coefficients to said control circuit means for supply to said digital filter, by selection and determination in a manner dependent upon the ratio of said first and second sample rates in which said sets of filter coefficients are formed according to a function $\Phi$, of which the Fourier transformed functions $\hat{\Phi}$ satisfy the following equation:

$$D^j \hat{\Phi}(2\pi k) = \begin{cases} \delta_{j,0}, & k = 0. \\ 0, & k \ne 0. \end{cases} j = 0, \ldots, r$$

wherein $D^j$ is the jth derivative, $\delta_{j,0} = 1$ for $j = 0$ and $\delta_{j,0} = 0$ for j other than 0, k is an integer and r is the extent to which the function f is r-fold continuously differentiable, and pulse generating means (4) for generating pulses of said second sample rate connected for supply of said pulses to said control circuit means.

2. The apparatus of claim 1, wherein said digital filter (6) implements the following function:

$$f(n \cdot T_1) = \sum_{k=(nT_1/T_0 - T)+1}^{(nT_1/T_0 + T)} f(k \cdot T_0) \cdot \phi(n \cdot T_1/T_0 - k) + R(\phi; T_0).$$

wherein $\phi$ is a function of the coefficients of said filter, R is an approximation error, k is an integer, n is a positive integer, $T_0$ is said first sample rate expressed as a period, T is a number for which $\phi(x) = 0$ while the absolute value of x is greater than or equal to T and in and k are natural number, $f(n \cdot T_1)$ being the signal provided at the output of said digital filter.

3. The apparatus of claim 2, wherein a selected set of coefficients $(a_{n,k})$ are obtained in accordance with the following function:

$$a_{n,k} = \Phi(n \cdot T_1/T_0 - k) \text{ for } k = k_1 \ldots {}^*k_l$$

and wherein said function $\Phi$ is a linear combination of B splines.

4. The apparatus of claim 1, wherein coefficient value memory means are provided for storing sets of coefficients for said digital filter respectively corresponding to sample rate ratios likely to be used in said apparatus, said filter coefficient selection means being equipped to call out a set of filter coefficients from said memory for furnishing to said filter by said control circuit means.

5. The apparatus of claim 1, wherein computing processor means (15) are provided for continually computing said coefficients for said digital filter in response to information regarding said first and second sample rates furnished to said computer processor means (15) by said filter coefficient selection means (3).

6. The apparatus of claim 1, further comprising means (11) for regulating the pulse rate of said pulse generating means in response to variations in degree of filling of said buffer memory above and below a mid-range of filling, for assuring consistency of said pulse generator output with the sampling rate ratio used to determine the coefficients of said filter.

7. Apparatus for converting a first digital signal having a first sample rate ($T_0$) and supplied at an input (23) of said apparatus into a second digital signal having a second sample rate ($T_1$) and supplied to an output (30) of said apparatus, comprising:

oversampling circuit means (24) connected to said apparatus input for interpolating compatible dummy samples between successive samples of said first sample rate ($T_0/m$) which is a multiple of said first sample rate ($T_0$), said oversampling circuit means including a following low-pass first digital filter (25) having an output;

buffer memory means (27) for temporarily storing samples provided by the output of said low-pass filter;

a second digital filter (28) for filtering samples read out of said buffer memory means and having an output connected to said apparatus output;

control and coefficient supply means (29) for controlling transfer of samples from said buffer memory (27) to said second digital filter (28) and for supplying filter coefficients to said second digital filter, and means for timing the output of said second digital filter supplied to said apparatus output (30) in step with pulses of said second sample rate.

8. The apparatus of claim 7, wherein said interpolated dummy samples are null value samples.

9. The apparatus of claim 7, wherein said buffer memory is a ring memory (27) and wherein said means for controlling transfer of samples from said buffer memory to said second digital filter is a means for transfer of samples from said ring memory to said second digital filter at a sample rate which is an integral multiple of said second sample rate.

10. The apparatus of claim 7, wherein said means for timing the output of said second digital filter comprises a controllable oscillator (16) providing a clock signal having a frequency which is a common multiple of said first and second sample rates, and frequency division means (17, 18, 19) connected to the output of said controllable oscillator (16) for providing, by frequency division, pulses of said first and said second sample rates and pulses of an oversampling rate which is an integral multiple of said first sample rate, for timing the interpolation of said dummy samples.

11. The apparatus of claim 10, wherein said controllable oscillator (16) is connected in a frequency and phase control loop (18, 21, 22) whereby the output pulses of said controllable oscillator (16) are locked in step with said first sample rate.

12. The apparatus of claim 9, wherein said means for controlling transfer of samples from said ring memory includes means (32) for regulating the generation of pulses of said second sample rate by reference to the difference between the write-in and read-out addresses of said ring memory (27).

13. The apparatus of claim 9, wherein said second digital filter implements the following function:

$$f(n \cdot T_1) = \sum_{k=(n \cdot m \cdot T_1/T_0 - T)+1}^{(n \cdot m \cdot T_1/T_0 + T)} f(k \cdot T_0/m) \cdot$$

-continued $$\Phi(n \cdot m \cdot T_1/T_0 - k)$$

wherein $\Phi$ is a function of the coefficients of said filter, $T_0$ is said first sample rate expressed as a period, $T_1$ is said second sample rate expressed as a period, $T$ is a number for which $\Phi(x) = 0$ while the absolute value of $x$ is greater than or equal to $T$, $f(k \cdot T_0/m)$ is the signal read into the ring memory 27, m representing the multiplication of the sample rate by said oversampling circuit means, and wherein means are provided for reading out samples from the ring memory for supply to said second digital filter at a sample rate of $T_1/k_s$, $k_s$ being a natural number.

\* \* \* \* \*